(12) United States Patent
Baldo et al.

(10) Patent No.: US 11,794,414 B2
(45) Date of Patent: Oct. 24, 2023

(54) ENERGY SOURCE MONITORING

(71) Applicant: HEWLETT-PACKARD DEVELOPMENT COMPANY, L.P., Spring, TX (US)

(72) Inventors: Nicola Baldo, Sant Cugat del Valles (ES); David Pinheiro, Sant Cugat del Valles (ES); Albert Trenchs Magana, Sant Cugat del Valles (ES); Esteve Comas Cespedes, Sant Cugat del Valles (ES)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 345 days.

(21) Appl. No.: 16/608,376

(22) PCT Filed: Jan. 29, 2018

(86) PCT No.: PCT/US2018/015711
§ 371 (c)(1),
(2) Date: Oct. 25, 2019

(87) PCT Pub. No.: WO2019/147281
PCT Pub. Date: Aug. 1, 2019

(65) Prior Publication Data
US 2020/0361154 A1    Nov. 19, 2020

(51) Int. Cl.
*B29C 64/393*    (2017.01)
*B33Y 50/02*    (2015.01)
*G01R 19/165*    (2006.01)
*G01R 21/00*    (2006.01)
*B29C 64/268*    (2017.01)

(52) U.S. Cl.
CPC .......... *B29C 64/393* (2017.08); *B29C 64/268* (2017.08); *B33Y 50/02* (2014.12); *G01R 19/16595* (2013.01); *G01R 21/00* (2013.01)

(58) Field of Classification Search
CPC ..... B29C 64/393; B29C 64/268; B33Y 50/02; B33Y 30/00; G01R 19/16595; G01R 21/00
See application file for complete search history.

(56) References Cited

U.S. PATENT DOCUMENTS

| | | |
|---|---|---|
| 5,073,786 A | 12/1991 | Shimada et al. |
| 5,359,178 A | 10/1994 | Kotani et al. |

(Continued)

FOREIGN PATENT DOCUMENTS

WO    WO2017058203 A1    4/2017

*Primary Examiner* — Thomas C Lee
*Assistant Examiner* — Tyler Dean Hedrick
(74) *Attorney, Agent, or Firm* — SHOOK, HARDY & BACON L.L.P.

(57) ABSTRACT

A method and apparatus is described in which a signal indicative of an operation of a energy source of a 3D printer during a second predetermined time period commencing with the end of a first predetermined time period is obtained, the first predetermined time period commencing with an activation of the energy source, wherein the energy source is active throughout the first and second time periods; the obtained signal is compared with a reference signal; and it is determined, based on the comparison, whether the energy source is operating according to predetermined characteristics.

3 Claims, 13 Drawing Sheets

(56) References Cited

U.S. PATENT DOCUMENTS

| | | | |
|---|---|---|---|
| 6,738,085 B2 | 5/2004 | Hachinoda | |
| 8,023,851 B2 | 9/2011 | Cao et al. | |
| 8,265,506 B2 | 9/2012 | Young-min et al. | |
| 10,065,371 B2* | 9/2018 | Martin | B29C 48/265 |
| 2008/0238488 A1* | 10/2008 | Comisky | G01R 31/40 |
| | | | 327/20 |
| 2010/0014881 A1* | 1/2010 | Cao | G03G 15/2003 |
| | | | 399/70 |
| 2013/0033303 A1* | 2/2013 | Morimoto | H01L 27/0629 |
| | | | 327/512 |
| 2013/0278962 A1 | 10/2013 | Coffey et al. | |
| 2016/0288254 A1* | 10/2016 | Pettit | B23K 26/144 |
| 2017/0144432 A1 | 5/2017 | Fosas et al. | |
| 2019/0091933 A1* | 3/2019 | Barbati | B29C 64/364 |
| 2020/0121378 A1* | 4/2020 | Katsuragi | A61B 18/10 |

\* cited by examiner

ENERGY SOURCE MONITORING

BACKGROUND

Additive manufacturing techniques, such as three-dimensional (3D) printing, relate to techniques for making 3D objects of almost any shape from a digital 3D model through additive processes in which 3D objects are generated on a layer-by-layer basis under computer control. A large variety of additive manufacturing technologies have been developed, differing in build materials, deposition techniques, and processes by which the 3D object is formed from the build material. Such techniques may include applying ultraviolet light to photopolymer resin, melting semi-crystalline thermoplastic materials in powder form, and electron-beam melting of metal powders.

Additive manufacturing processes usually begin with a digital representation of a 3D object to be manufactured. This digital representation is virtually sliced into layers by computer software or may be provided in pre-sliced format. Each layer represents a cross-section of the desired object, and may be sent to an additive manufacturing apparatus, that in some instances is known as a 3D printer, where it is built upon a previously built layer. Alternatively, a 3D printer may be provided with a 3D object model and the printer itself performs the slicing process. This process is repeated until the object is completed, thereby building the object layer-by-layer. While some available technologies directly print material, others use a recoating process to form additional layers that can then be selectively solidified in order to create the new cross-section of the object.

Some 3D printers use one or more energy sources as part of the printing process. For instance, the energy source may comprise a heating element or a UV lamp. In such systems control of the amount of power delivered by the energy source allows for control over the printing process, for instance the rate of fusing of build material. If the power is not accurately controlled, the print quality may be impacted. A calibration process can be performed before a printing operation to determine the correct input signals to cause an energy source to deliver the appropriate amount of power during subsequent printing operations.

BRIEF INTRODUCTION OF THE DRAWINGS

Examples are further described hereinafter with reference to the accompanying drawings, in which.

DETAILED DESCRIPTION

As noted above, a 3D printer may include one or more energy sources. One example presented in the following description, is a "heating element". No part of the following description should be considered to be limited to heating elements. It will be appreciated that a heating element itself may be any suitable component for heating build materials during a 3D printing operation. For example, a heating element may comprise a heating lamp. It will also be appreciated that the present disclosure is applicable to other techniques and other forms of energy sources that may be used to deliver energy to build materials, such as ultraviolet lamps and electron-beams. For instance, an energy source in the form of a UV lamp may be applicable to curing binder agents for fusing build material. It will be appreciated that the present disclosure is not limited to use with a single energy source. That is, a 3D printing operation may involve multiple energy sources, for instance multiple heating elements, and the techniques described below may be used to determine that each energy source is operating according to respective predetermined characteristics. For example, a 3D printing operation may use a heating lamp to heat a build material to a general operating temperature and a fusing lamp to fuse the build material.

Figure 1:
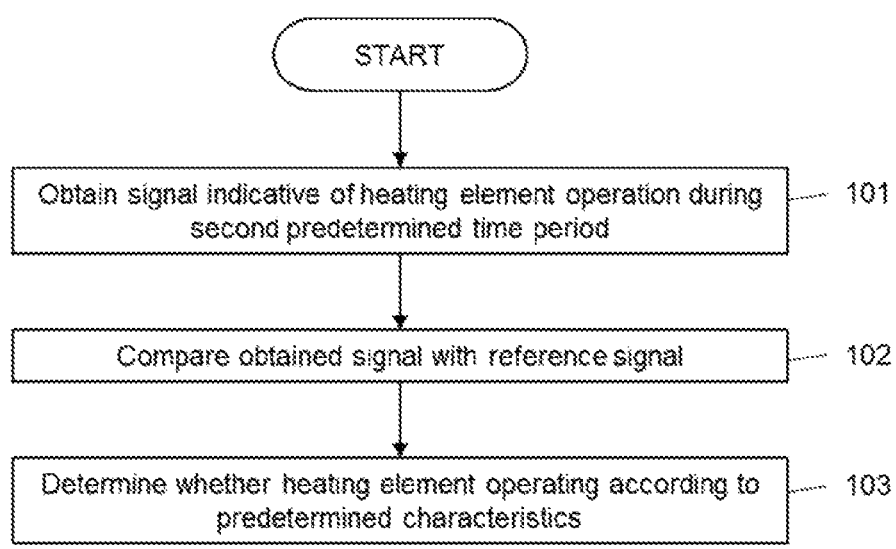
FIG. 1 shows an example method according to an example of the disclosure.

FIG. 1 shows an example method according to an example of the disclosure. At 101 a signal may be obtained that is indicative of an operation of an energy source, for instance a heating element, of a 3D printer during a second predetermined time period. The second predetermined time period commences with the end of a first predetermined time period, the first predetermined time period commencing with an activation of the heating element. That is, when a heating element is activated, a first predetermined time period may commence. At the end of the first predetermined time period, a second predetermined time period may commence. The heating element may be continuously active throughout the first predetermined time period and throughout the second predetermined time period and the obtained signal may be indicative of the operation of the heating element during the second predetermined time period.

At 102, the obtained signal may be compared with a reference signal. That is, the signal obtained at 101 that is indicative of an operation of the heating element during the second predetermined time period may be compared with a reference signal.

At 103, it may be determined, based on the comparison, whether the heating element is operating according to predetermined characteristics. That is, based on the comparison of the obtained signal with the reference signal at 102, it may be determined whether the heating element is operating according to predetermined characteristics.

Figure 10:
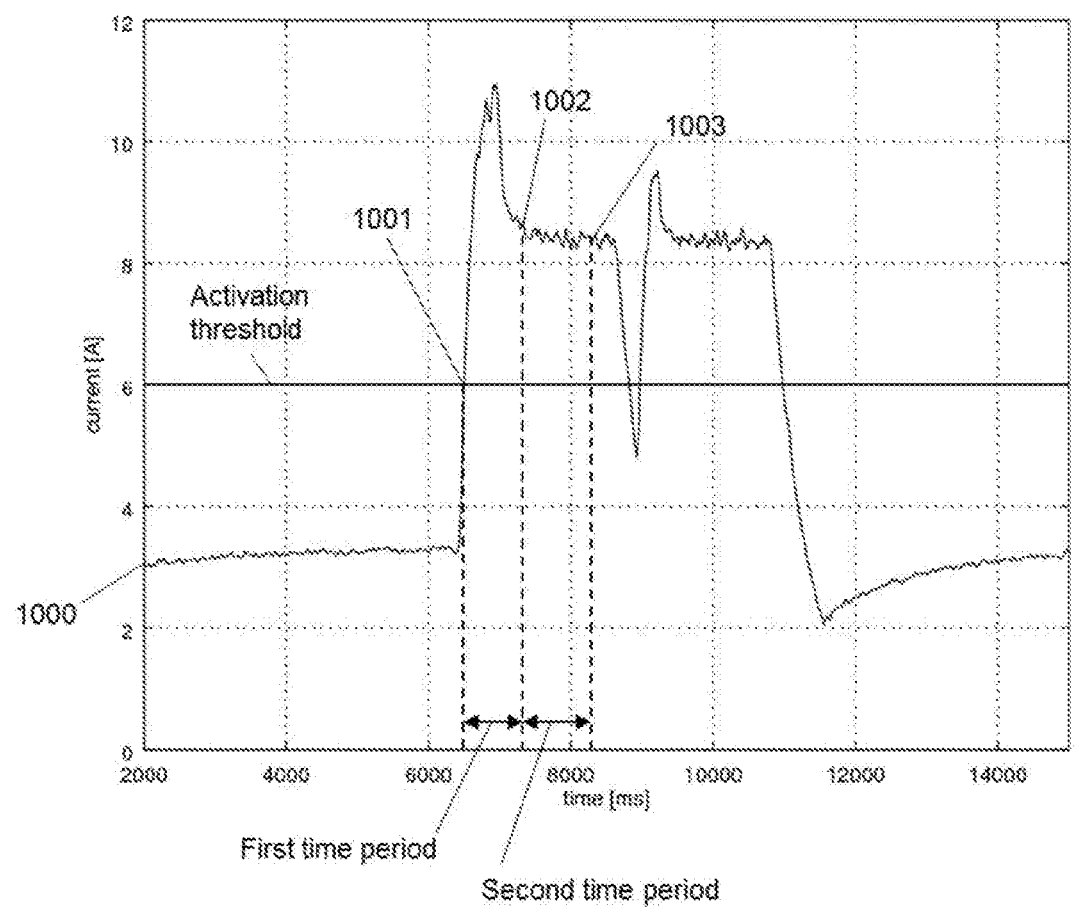
FIG. 10 shows an example of an activation detector module operation according to an example of the disclosure.

In some examples, the second predetermined time period may correspond to a time in which the heating element is expected to be operating in a stable state. That is, the second predetermined time period may be a period in which the value of the signal indicative of an operation of the heating element is expected to be stable and therefore suitable for determining if the heating element is operating according to predetermined characteristics. The first predetermined time period may correspond to a time period in which the heating element may be operating in an unstable state before it reaches a stable state following activation of the heating element. That is, the first predetermined time period may be a period in which the value of the signal indicative of an operation of the heating element is expected to be unstable and therefore less suitable for determining if the heating element is operating according to predetermined characteristics. An example of a signal indicative of an operation of a heating element is illustrated in FIG. 10, which will be described in detail below. In some examples, the first predetermined time period and/or the second predetermined time periods may additionally correspond to times in which a value of the signal indicative of an operation of the heating element is expected to exceed a predetermined threshold.

In some examples, the signal indicative of an operation of the heating element may be a signal indicative of the temperature of the heating element or the output power of the heating element. For example, the signal may be a measured temperature or output power of the heating element obtained using an internal or external sensor, or may be any measurement for indicating the temperature or output power of the heating element, such as a current measurement, voltage measurement, or any other suitable measurement.

Figure 14:
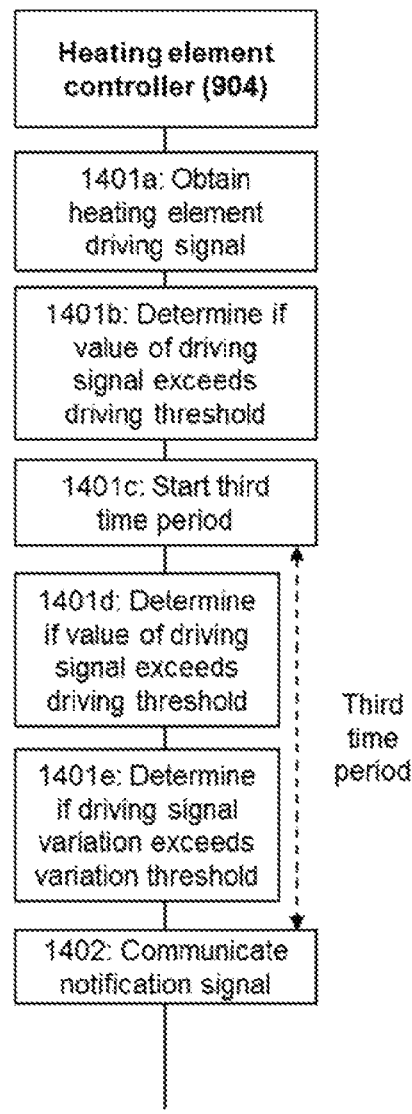
FIG. 14 shows an example of an operation of an energy source controller according to an example of the disclosure.

For example, the signal indicative of an operation of the heating element may be a measurement of the current drawn by the heating element. The current drawn by the heating element may be a readily available parameter for monitoring for an electrically powered heating element, and may be a reliable indicator of a stable heating operation. The heating element may be driven by a modulated power source driven by a heating element controller 904 via a modulation signal. For example, a sinewave controller may provide a modulated power voltage to drive a heating element. The sinewave controller may be driven by a pulse-width modulation signal supplied by the heating element controller 904. In some examples an analogue measurement of the current drawn by the heating element may be converted to a digital signal, for example by an analogue-to-digital converter. In some examples, the current measurement may be processed to remove noise, for example by a low pass filter. An example of a 3D printing apparatus is illustrated in FIG. 14, which is described in detail below. It will be appreciated that these are merely examples, and that any suitable signal processing techniques may be applied to the measurements and signals.

In some examples the reference signal may comprise a predetermined range. The heating element may be determined to be operating according to predetermined characteristics if maximum and minimum values of the obtained signal are within the predetermined range. In some examples, the obtained signal may be a full analogue or digital measurement of, for example, the current drawn by the heating element during the second predetermined time period, and the minimum and maximum values may be extracted from the obtained signal. In some examples, the obtained signal may be the minimum and maximum values that have previously been extracted from the measurement. The maximum and minimum values may be checked to determine if they are inside a predetermined range. If they are within the predetermined range, the heating element may be determined to be operating according to predetermined characteristics. For example, if the minimum and maximum values of the obtained signal are within the predetermined range, it may be determined that the heating element is correctly calibrated, which may mean that the build material is being heated accurately and reliably and that the current 3D printing operation can be expected to be performed within acceptable tolerances. If at least one of the minimum or maximum values is not within the predetermined range, the heating element may be determined not to be operating according to predetermined characteristics. For example, if the minimum and maximum values of the obtained signal are not within the predetermined range, it may be determined that the heating element is not correctly calibrated. This may mean that the build material is not being heated accurately and reliably and that the 3D printing operation may not be performed within acceptable tolerances. In some examples, this may lead to the output of a warning signal indicating that the heating element is not operating correctly, or may lead to the stopping or cancellation of the 3D printing operation. It will be appreciated that the predetermined range may depend on characteristics of the printing apparatus, heating element, 3D printing operation, etc., or may vary during the 3D printing operation. For example, the predetermined range may be increased for a low-accuracy 3D printing operation such as printing a rough prototype or may decrease over the course of a 3D printing such that the 3D printing operation is more likely to be cancelled at the start of the operation (when it might waste time and resources to finish an operation that is likely to be flawed) and less likely to be cancelled at the end of an operation (where it might be more wasteful to not finish an operation given the time and resources already consumed).

Alternatively, or additionally, the reference signal may comprise one or more predetermined thresholds and the heating element may be determined to be operating according to predetermined characteristics if the values or average value of the obtained signal are less than and/or greater than certain predetermined thresholds. For example, the reference signal may comprise a single predetermined threshold, and it may be determined that activation of the heating element has failed or that the heating element is broken if the maximum value of the obtained signal does not exceed the predetermined threshold. In some examples, the reference signal may comprise a single predetermined threshold value for determining if the heating element is broken in addition to or in place of the predetermined range as described above for determining if the heating element is correctly calibrated. It will be appreciated that these are merely examples and that any suitable reference signal comprising any suitable combination of values and ranges may be compared with any suitable characteristics of the obtained signal to determine whether the heating element is operating according to predetermined characteristics. Furthermore, it will be appreciated that the reference signal may not comprise static values or ranges and may, for example, comprise values or ranges that vary with time or vary based on characteristics of the printing operation. For example, the reference signal may be set to increase to reflect an expected period of high temperature, or to vary over the duration of the printing operation to reflect known variations in the current drawn to maintain a certain heating element temperature.

Figure 2:
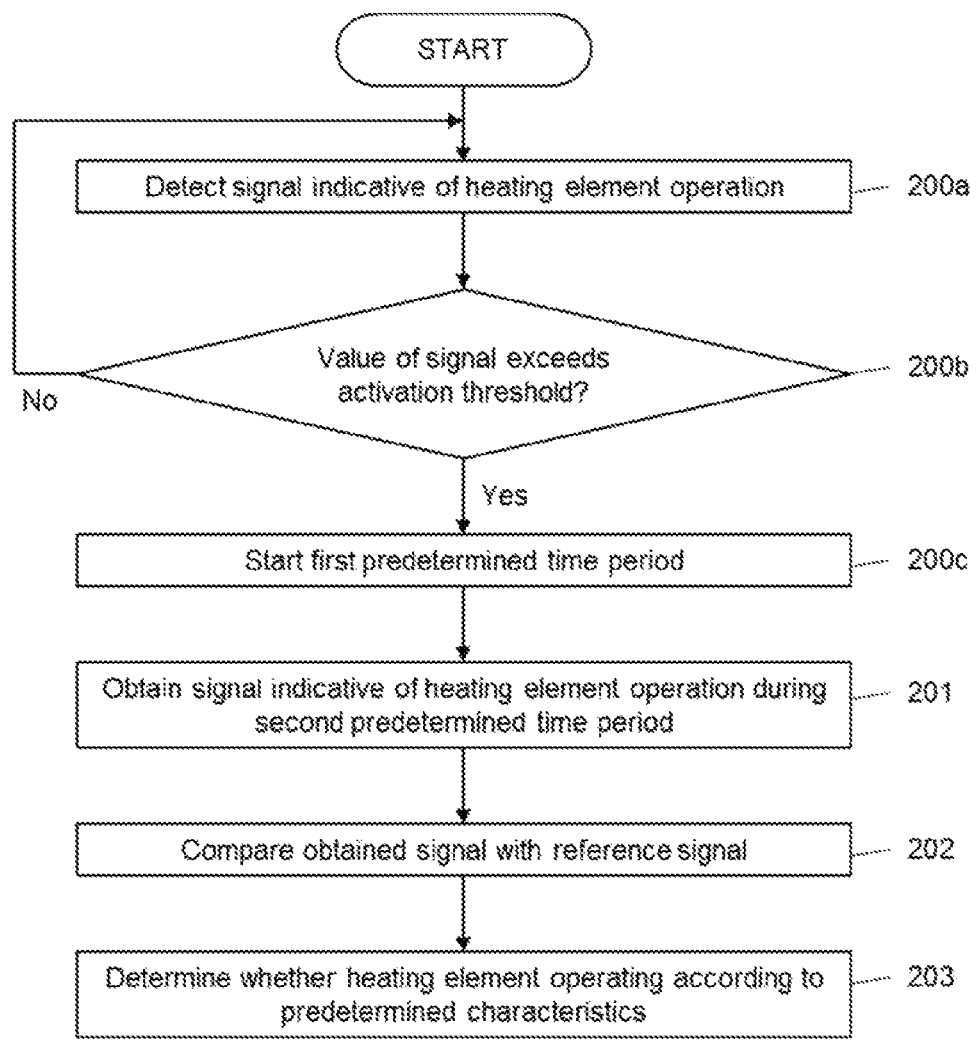
FIG. 2 shows an example method according to an example of the disclosure.

FIG. 2 shows an example method according to an example of the disclosure. In some examples, obtaining a signal indicative of an operation of the heating element may comprise detecting a signal indicative of a heating element operation, and starting a timer for the first predetermined time period if a value of the detected signal exceeds a predetermined activation threshold. That is, a timer for the first predetermined time period may be started when a value of a detected signal indicative of a heating element operation exceeds a predetermined activation threshold. The predetermined activation threshold may be set such that a timer for the first predetermined time period is not started unless a signal with values suitable for reliably determining if the heating element is operating according to predetermined characteristics is detected. For example, it may be the case that the heating element is deliberately activated at a low temperature at times during the 3D printing operation and that this activation does not result in a signal suitable for reliably determining if the heating element is correctly calibrated.

Processes 201, 202, and 203 in FIG. 2 are the same as 101, 102, and 103 in FIG. 1, respectively. At 200a, a signal indicative of a heating element operation may be detected. At 200b, it may be determined whether a value of the detected signal exceeds a predetermined activation threshold. That is, a value of the detected signal may be compared with a predetermined activation threshold, and if the value exceeds the predetermined activation threshold, the method may proceed to 200c. If the value of the detected signal does not exceed the predetermined activation threshold, the method may restart and await detection of a signal indicative of a heating element operation at 200a.

At 200c, the first predetermined time period may be started. That is, if the value of the detected signal exceeds the predetermined activation threshold, a timer corresponding to the first predetermined time period may be started. At the end of the first predetermined time period, the second predetermined time period commences and the signal indicative of heating element operation is obtained at 201, at the end of the second predetermined time period.

In some examples, if a value of the detected signal decreases below a predetermined activation threshold during the first predetermined time period or during the second predetermined time period, the comparison of the obtained signal to the reference signal may not be performed. That is, the detected signal may be continuously monitored or may be monitored at intervals, and if it is determined that a value of the signal fails to exceed the activation threshold at any point during the first predetermined time period or the second predetermined time period, the method may not proceed (for example, the signal indicative of an operation of the heating element may not be obtained), or may be restarted. Restarting the method may comprise returning to the start of the method to await a new activation of the heating element. A determination that a value of the detected signal falls below the activation threshold at any point during the first or second predetermined time periods may be an indication that the present heating element operation is not suitable for reliably determining if the heating element is operating according to predetermined characteristics. In some examples, a signal may be output to indicate or record that the heating element operation was not suitable.

It will be appreciated that in some examples additional conditions might have to be satisfied to determine that the heating element operation was not suitable. For example, instead of the heating operation being deemed unsuitable if the detected signal falls below the activation threshold at any point during the first predetermined time period or the second predetermined time period, the heating element operation may be deemed unsuitable if the detected signal falls below the activation threshold for a certain proportion of the first or second predetermined time periods, or if the detected signal fails to exceed the activation threshold for a continuous predetermined length of time during the first predetermined time period or during the second predetermined time period. In some examples, the monitoring or determination may be performed during the first predetermined time period, or may be performed during the second predetermined time period. In some examples, the determination may be performed at the end of the second predetermined time period.

Figure 3:
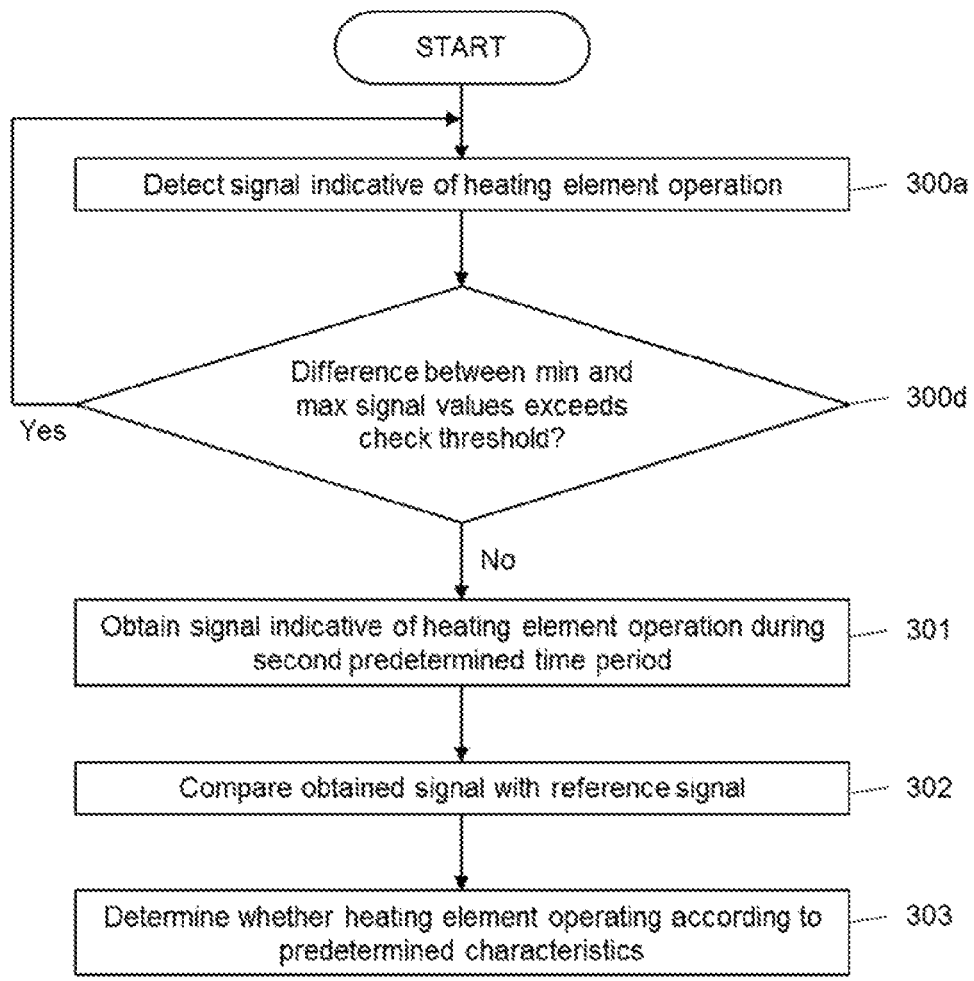
FIG. 3 shows an example method according to an example of the disclosure.

FIG. 3 shows an example method according to an example of the disclosure. In some examples, the method may comprise determining whether a difference between minimum and maximum values of the detected signal during the second predetermined time period exceeds a predetermined check threshold. The determination may be performed at the end of the second predetermined time period, or continuously or at predetermined intervals throughout the second predetermined time period. If the difference does exceed the predetermined check threshold, the comparison of the obtained signal to the reference signal may not be performed. That is, a difference between minimum and maximum values of the detected signal may be compared to a predetermined check threshold, and if the difference exceeds the predetermined check threshold, the method may not proceed to comparing the obtained signal to the reference signal. For example, if a difference between the minimum and maximum values exceeds the predetermined check threshold, it may indicate that the heating element operation was not stable enough for a meaningful or reliable comparison with a reference signal to be performed, and the method may be restarted. In some examples, a signal may be output to indicate or record that the heating element operation was not stable.

Processes 301, 302, and 303 in FIG. 3 are the same as 101, 102, and 103 in FIG. 1. At 300a, a signal indicative of a heating element operation may be detected. At 300d it may be determined whether a difference between minimum and maximum values of the detected signal exceeds a predetermined check threshold. That is, a difference between the minimum and maximum values of the detected signal is compared to a predetermined check threshold. If the differences does exceed the predetermined check threshold, the method may restart and await a new detection at 300a. If the difference does not exceed the predetermined check threshold, the method may continue to 301.

Figure 4:
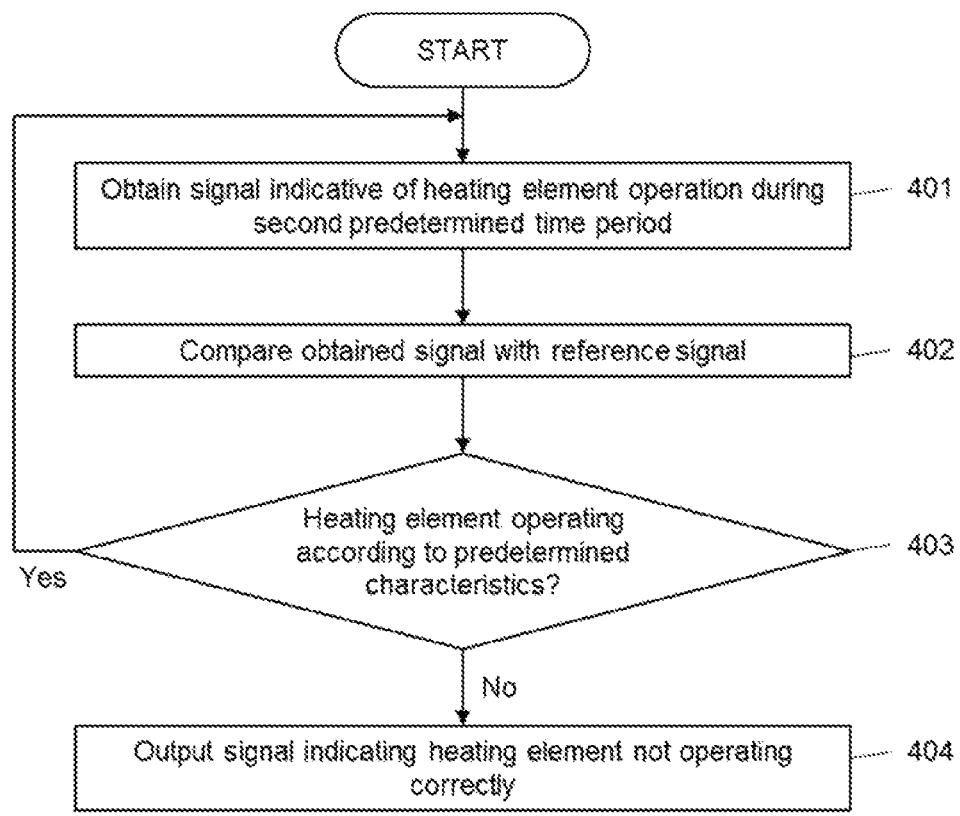
FIG. 4 shows an example method according to an example of the disclosure.

FIG. 4 shows an example method according to an example of the disclosure. In some examples, the method may comprise outputting a signal indicating that the heating element is not operating correctly if it is determined that the heating element is not operating according to predetermined characteristics. It will be appreciated that this signal could be output to other system components, to another system, to a user, and could be recorded, logged, processed, etc. In some examples, the signal may lead to the 3D printing operation being stopped. For example, if the signal indicates that the heating element is broken, failed to activate, or is incorrectly calibrated, the 3D printing operation may be stopped. In some examples, the signal may not cause the 3D printing operation to be stopped. For example, if the signal indicates that the heating element is incorrectly calibrated but within a predetermined tolerance, the 3D printing operation may continue while informing the user of the incorrect calibration, or scheduling a recalibration process. In some examples, the user may configure the tolerances to determine when the 3D printing operation should be stopped. For example, the user may configure the tolerances to be low or zero for a high-accuracy printing operation. In some examples, the user may configure the tolerances to vary over the duration of the printing operation. For example, the tolerances may be configured to be lower at the start of the printing operation and higher at the end of the printing operation, meaning that less accurate calibration is permissible as the operation nears completion without the process being aborted.

Processes 401, 402, and 403 are the same as 101, 102, and 103 in FIG. 1 respectively. In addition, at 403, if it is determined that the heating element is operating according to predetermined characteristics, the method may restart and await a new activation of the heating element at 401. If it is determined that the heating element is not operating according to predetermined characteristics the method may proceed to 404. At 404, a signal indicating that the heating element is not operating correctly may be output.

Figure 5:
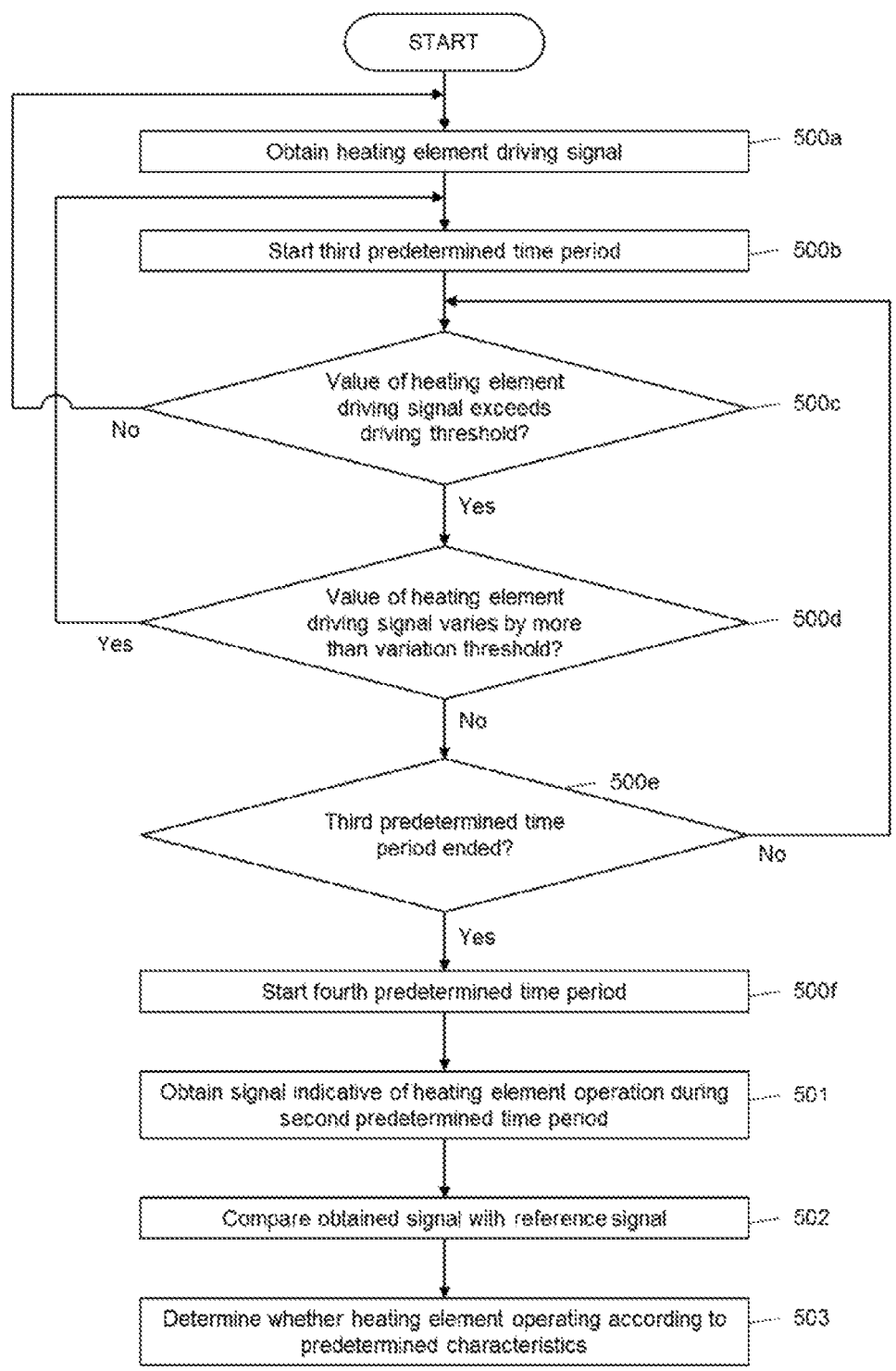
FIG. 5 shows an example method according to an example of the disclosure.

FIG. 5 shows an example method according to an example of the disclosure. In some examples, the method may further comprise obtaining a heating element driving signal or a signal indicative of the driving signal. The heating element driving signal may be the signal supplied to the heating element to heat it to the temperature for the 3D printing operation. The method may further comprise starting a timer for a third predetermined time period if a value of the heating element driving signal exceeds a predetermined driving threshold, stopping the timer for the third predetermined time period if the value of the heating element driving signal decreases below the predetermined driving threshold, restarting the timer for the third predetermined time period if the value of the heating element driving signal varies by more than a predetermined variation threshold, and starting a timer for a fourth predetermined time period at the end of the third predetermined time period, wherein the heating element is determined not to be operating according to the predetermined characteristics if the signal indicative of an operation of a heating element is not obtained by the end of the fourth predetermined time period.

Processes 501, 502, and 503 in FIG. 5 are the same as 101, 102, and 103 in FIG. 1, respectively. At 500*a*, a heating element driving signal may be obtained. That is, a signal for driving the heating element may be obtained. The signal may be obtained before it is passed to the heating element. At 500*b*, a timer for a third predetermined time period may be started. That is, a timer for a third predetermined time period may start when a heating element driving signal is obtained. Starting the timer for the third predetermined time period may be conditional on a value of the heating element driving signal exceeding a predetermined driving threshold. A determination that a value of the heating element driving signal fails to exceed the driving threshold may be an indication that when the heating element driving signal drives a heating element operation, it would not be suitable for reliably determining if the heating element is operating according to predetermined characteristics.

At 500*c*, it may be determined if a value of the heating element driving signal exceeds the predetermined driving threshold. That is, the heating element driving signal may be continuously monitored or may be monitored at intervals, and if it is determined that a value of the signal falls below the driving threshold at any time during the third time period, the method may not proceed, or may be restarted. Restarting the method may comprise returning to the start of the method to await the obtaining of a heating element driving signal at 500*a*.

At 500*d*, it may be determined if a value of the heating element driving signal varies by more than a predetermined variation threshold. For example, a present value of the heating element driving signal may be compared with a past value of the heating element driving signal. If the difference between the present and past values exceeds a predetermined variation threshold, it may be determined that the present value of the heating element driving signal varies by more than a predetermined variation threshold. If it is determined that a value of the heating element driving signal varies by more than a predetermined variation threshold, the method may return to 500*b* and the third predetermined time period may be restarted.

At 500*e*, it may be determined if the third predetermined time period has ended. If the third predetermined time period has not ended, the method may return to 500*c*. If the third predetermined time period has ended, the method may proceed to 500*f*. It will be appreciated that the combined effect of 500*d* and 500*e* is to define a check during the third predetermined time period that resets the third predetermined time period if the heating element driving signal varies significantly. It will be appreciated that the check may be performed continuously or may be performed at intervals. In some examples, the check may be performed once, at the end of the third predetermined time period. That is, the order of 500*d* and 500*e* in FIG. 5 may be reversed in some examples.

At 500*f*, a timer for a fourth predetermined time period may be started. If the signal indicative of an operation of a heating element is not obtained by the end of the fourth predetermined time period the heating element may be determined not to be operating according to the predetermined characteristics. In some examples, a signal may be output to indicate that the heating element is not operating according to predetermined characteristics. That is, the starting of the timer for the fourth predetermined time period at 500*f* may indicate that the heating element driving signal has been determined during 500*b*-500*d* to be suitable for driving an operation of the heating element that can be expected to result in obtaining a signal indicative of an operation of the heating element that is suitable for determining if the heating element is operating according to predetermined characteristics. If the fourth predetermined time period ends without such a signal being obtained, this is thus itself an indication that the heating element is not operating according to predetermined characteristics. For example it may indicate that the heating element is broken (if no signal indicative of an operation of the heating element can be detected despite the heating element driving signal being determined to be suitable) or defective/wrongly calibrated (if the detected signal does not exceed a predetermined activation threshold despite the heating element driving signal being determined to be suitable).

In some examples, reference signals or predetermined thresholds to be used subsequently may be calculated based on the heating element driving signal. For example, the value of the heating element driving signal at the end of the third predetermined time period may be used to calculate a reference signal for comparison with the obtained signal at 502.

Figure 6:
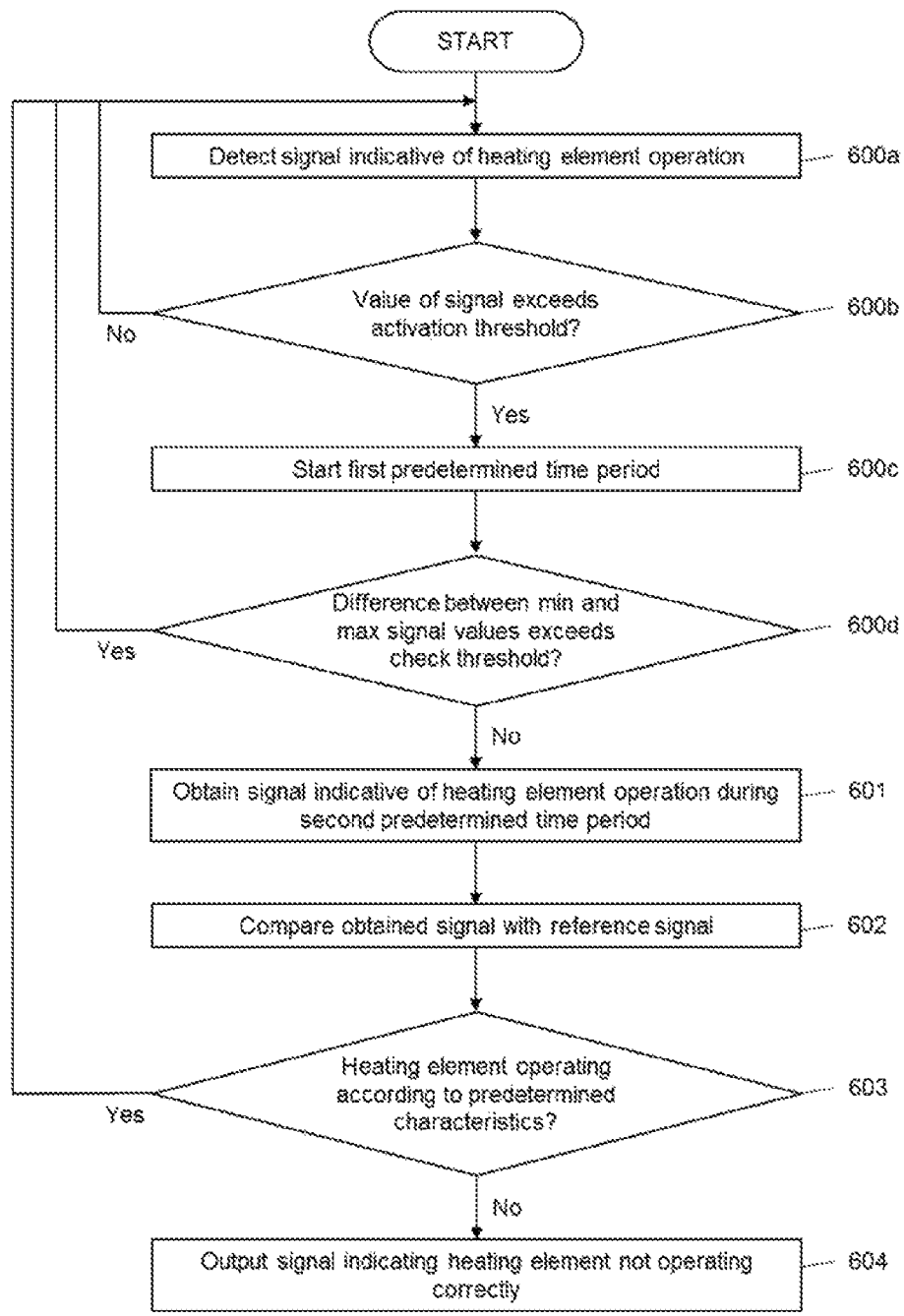
FIG. 6 shows an example method according to an example of the disclosure.

It will be appreciated that the examples described above may be combined in any combination unless this would result in a contradiction. For example, any combination of processes 101-103, 200*a*-200*c*, 301*a*-300*d*, 404, and/or 500a-500f is possible. FIG. 6 shows one example combination according to an example of the disclosure. Processes 601, 602, and 603 are the same as 101, 102, and 103 in FIG. 1, respectively; 600a, 600b, and 600c are the same as 200a, 200b, and 200c in FIG. 2 respectively; 601d is the same as 301d in FIG. 3; and 604 is the same as 404 in FIG. 4.

Figure 7:
FIG. 7 shows an example energy source monitoring system and energy source according to an example of the disclosure.

FIG. 7 shows an example heating element monitoring system 700 and heating element 710 according to an example of the disclosure. The methods described herein may be performed by the heating element monitoring system 700. For example, the heating element monitoring system 700 may obtain a signal indicative of an operation of a heating element 710 of a 3D printer during a second predetermined time period commencing with the end of a first predetermined time period, the first time period commencing with an activation of the heating element 710. That is, the first predetermined time period may commence with an activation of the heating element 710, the second predetermined time period may commence with the end of the first predetermined time period, and signal indicative of an operation of the heating element 710 during the second predetermined time period may be obtained. The heating element 710 may be active throughout the first and second time periods. The heating element monitoring system 700 may compare the obtained signal with a reference signal, and determine, based on the comparison, whether the heating element 710 is operating according to predetermined characteristics.

Figure 8:
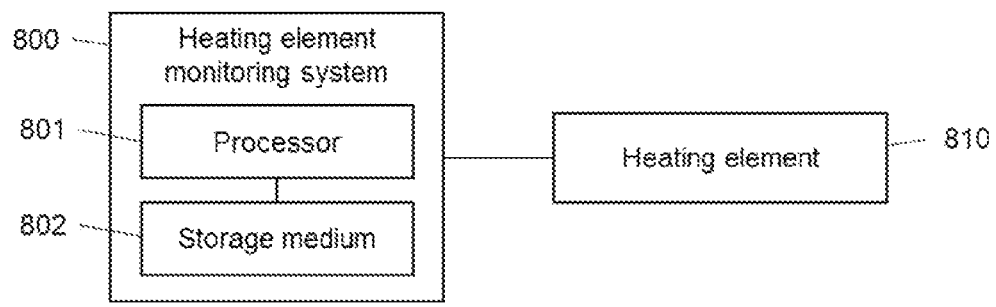
FIG. 8 shows an example energy source monitoring system and according to an example of the disclosure.

FIG. 8 shows an example heating element monitoring system 800 and heating element 810 according to an example of the disclosure. The heating element monitoring system 800 may comprise a processor 801 and a non-transitory machine readable storage medium 802 encoded with or comprising instructions or modules executable by the processor 801 to perform any of the methods described herein. For example, the non-transitory machine readable storage medium 802 may be encoded with instructions executable by the processor 801, the machine readable storage medium 802 comprising: instructions to obtain a signal indicative of an operation of a heating element 810 of a 3D printer during a second predetermined time period commencing with the end of a first predetermined time period, the first predetermined time period commencing with an activation of the heating element 810, wherein the heating element 810 is active throughout the first and second time periods; instructions to compare the obtained signal with a reference signal; and instructions to determine, based on the comparison, whether the heating element 810 is operating according to predetermined characteristics.

Figure 9:
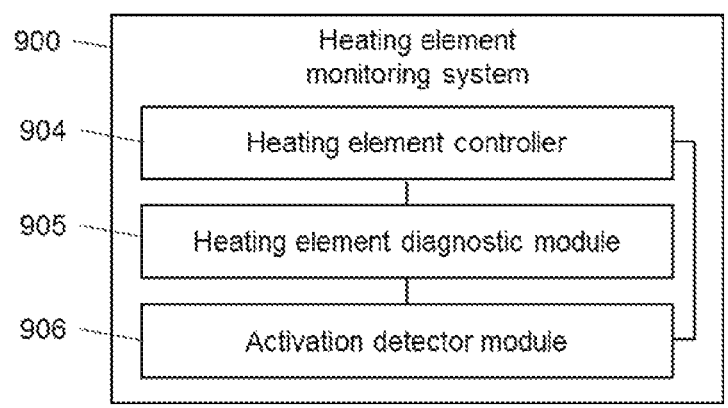
FIG. 9 shows an example energy source monitoring system according to an example of the disclosure.

FIG. 9 shows an example heating element monitoring system 900 according to an example of the disclosure. The system may comprise a heating element controller 904, a heating element diagnostic module 905, and an activation detector module 906.

The heating element controller 904, heating element diagnostic module 905, and activation detector module 906 may be separate components within the heating element monitoring system 900 and each may comprise a processor and a non-transitory machine readable storage medium encoded with or comprising instructions or modules executable by the processor to perform any of the methods described herein. Alternatively, the heating element controller 904, activation detector module 906, and/or heating element diagnostic module 905 may be modules of a single processor and a non-transitory machine readable storage medium. For example, the modules may be software modules of a processor and a non-transitory machine readable storage medium. It will be appreciated that the separation of components and operations described herein are merely examples, and that any suitable separation or combination could in principle be used. Separation of the components, as shown in FIG. 14, for example, may allow computationally intensive tasks to be performed close to where the input signals for these computations may be read. This may mean that only the results of the computations need to be exchanged, thereby minimizing communication overheads.

In some examples, the heating element diagnostic module 905 may perform the methods described in relation to FIG. 1. For example, the heating element diagnostic module 905 may perform processes 101-103 in FIG. 1. In some examples, the reference signal may comprise a predetermined range as described above, and the heating element diagnostic module 905 may determine that the heating element is operating according to predetermined characteristics if the maximum and minimum values of the obtained signal are within the predetermined range. If minimum and maximum values of the obtained signal are not within the predetermined range, the heating element diagnostic module 905 may determine that the heating element is not operating according to predetermined characteristics.

In some examples, the activation detector module 906 may perform processes 200a-200b in FIG. 2. That is, the activation detector module 906 may detect a signal indicative of a heating element operation and start a timer for the first predetermined time period when it determines that a value of the detected signal exceeds a predetermined activation threshold.

In some examples, the activation detector module 906 may monitor the detected signal to determine if a value of the detected signal exceeds the predetermined activation threshold during the first predetermined time period and second predetermined time period. The determination may be performed at the end of the second predetermined time period, the end of each predetermined time period, or continuously or at predetermined intervals throughout the predetermined first and/or second time periods. If it is determined by the activation detector module 906 that a value of the detected signal does not exceed the predetermined activation threshold, the operation may stop. That is, if a value of the detected signal decreases below the predetermined activation threshold at any point during the first or second predetermined time periods, the activation detector module 906 may stop timing the respective time period and may await detection of a new heating element activation.

In some examples, the activation detector module 906 may perform processes 300a-300d in FIG. 3. That is, the activation detector module 906 may determine whether a difference between minimum and maximum values of the detected signal during the second predetermined time period exceeds a predetermined check threshold. The determination may be performed at the end of the second predetermined time period, or continuously or at predetermined intervals throughout the second predetermined time period. If the activation detector module 906 determines that a difference exceeds the predetermined check threshold, the activation detector module 906 may not communicate the signal indicative of a heating element operation to the heating element diagnostic module 905 and/or the comparison of the obtained signal to the reference signal may be cancelled. For example, if the difference between minimum and maximum values exceeds the predetermined check threshold, it may indicate that the heating element operation was not stable enough for a meaningful comparison to be performed, and the activation detector module 906 may await detection of a new heating element activation. In some examples, a signal may be output by the activation detector module 906 to indicate or record that the heating element operation was not stable.

FIG. 10 shows an example of an activation detector module 906 operation according to an example of the disclosure. In the example of FIG. 10, an example trace 1000 of the current drawn by the heating element over time is shown. In the example of FIG. 10, the predetermined activation threshold is 6 A. At time 1001 the activation detector module 906 determines, as in process 200b of FIG. 2 for example, that the current exceeds the activation threshold and a timer for the first predetermined time period is started. At time 1002, the first predetermined time period ends and a timer for the second predetermined time period is started. At time 1003, the second predetermined time period ends. As explained above, and as illustrated in FIG. 10, the first predetermined time period may correspond to a period in which the current signal is expected to be unstable, for example as the heating element warms up, and the second predetermined time period may correspond to a period in which the current signal is expected to be relatively stable.

As described above, the activation detector module 906 may also monitor the detected signal to ensure that it does not fall below the activation threshold during the first and second predetermined time periods. In FIG. 10 it can be seen that the current exceeds the activation threshold of 6 A throughout the first and second predetermined time periods. Consequently, the detected signal may be determined to be suitable for determining if the heating element is operating according to predetermined characteristics and a signal indicative of the operation of the heating element may be generated. It will be appreciated that this may also be conditional on determining that the difference between the difference between minimum and maximum values of the detected signal during the second predetermined time period exceeds a predetermined check threshold, as in process 300d of FIG. 3.

In some examples, the heating element diagnostic module 905 may perform process 404 in FIG. 4. That is, when it is determined that the heating element is not operating correctly or is not operating according to predetermined characteristics, a signal may be output by the heating element diagnostic module 905. For example, the heating element diagnostic module 905 may output a signal indicating that the heating element is not operating correctly if it is determined that the heating element is not operating according to predetermined characteristics. In some examples the signal may be output to the heating element controller 904, which may determine if the 3D printing operation should be stopped, as described above.

In some examples, the heating element controller 904 may perform processes 500a-500e in FIG. 5. That is, the heating element controller 904 may obtain a heating element driving signal, start a timer for a third predetermined time period if a value of the heating element driving signal exceeds a predetermined driving threshold, stop the timer for the third predetermined time period if the value of the heating element driving signal decreases below the predetermined driving threshold, restart the timer for the third predetermined time period if the value of the heating element driving signal varies by more than a predetermined variation threshold, and output a notification signal at the end of the third predetermined time period.

In some examples, the heating element diagnostic module 905 may perform process 500f in FIG. 5. That is, the heating element diagnostic module 905 may start a timer for a fourth predetermined time period when the notification signal is detected, and determine that the heating element is not operating according to the predetermined characteristics if the signal indicative of an operation of a heating element is not obtained by the end of the fourth predetermined time period. That is, the fourth predetermined time period may correspond to a period in which a signal indicative of a heating element is expected to be obtained if the heating element is operating according to the predetermined characteristics.

In some examples, the system may comprise a heating element controller 904 to activate the heating element and communicate a notification signal to a heating element diagnostic module 905, an activation detector module 906 to detect activation of the heating element, start the first predetermined time period when activation of the heating element is detected, start the second predetermined time period at the end of the first predetermined time period, and communicate, at the end of the second predetermined time period, the signal indicative of an operation of the heating element during the second predetermined time period to the heating element diagnostic module 905, and a heating element diagnostic module 905 to, start if the notification signal is received from the heating element controller 904, a fourth predetermined time period, and output, if the signal indicative of an operation of the heating element is not obtained from the activation detector module 906 by the end of the fourth predetermined time period, a signal indicating that the heating element is not operating correctly.

Figure 11:
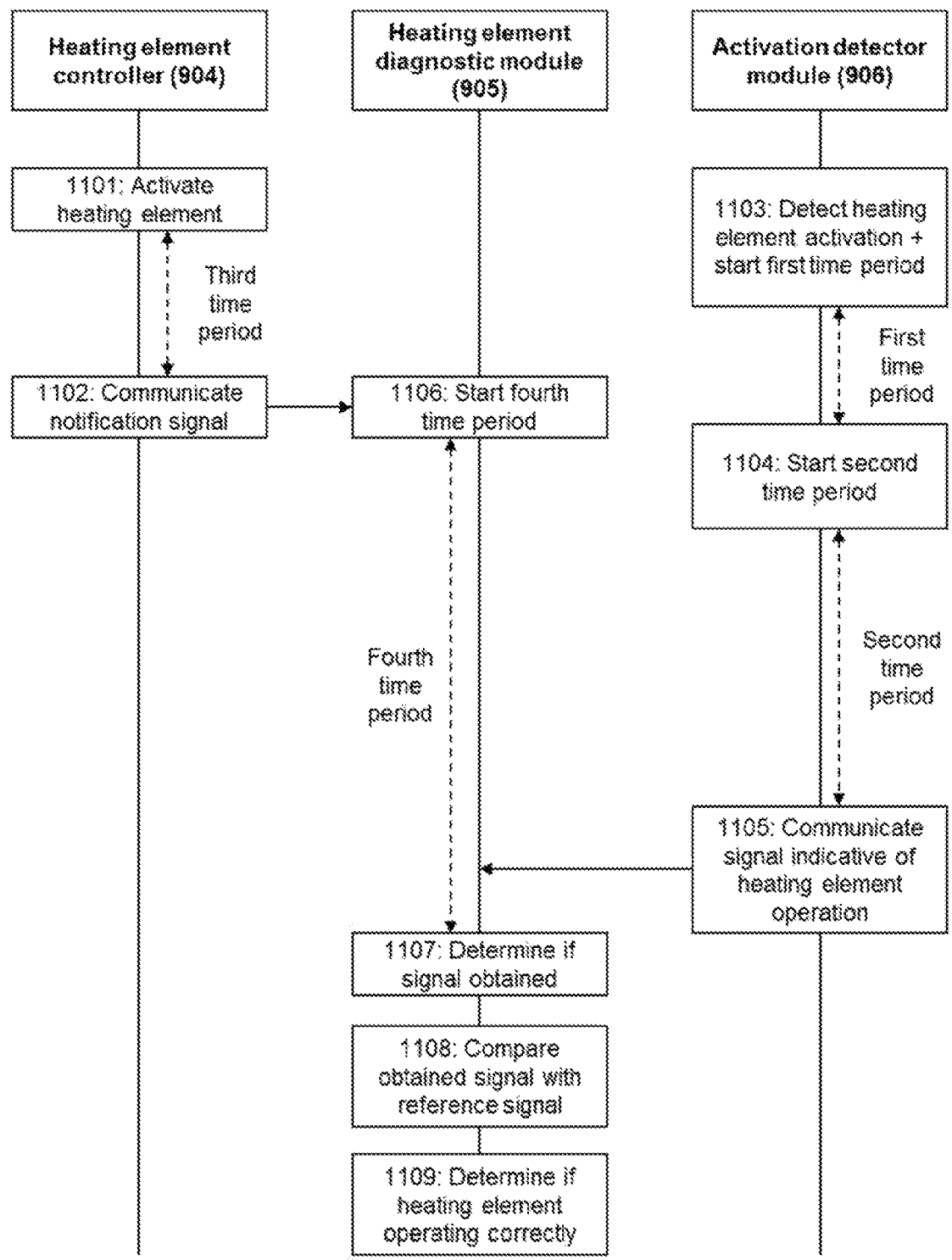
FIG. 11 shows an example of the operation of an energy source monitoring system according to an example of the disclosure.

FIG. 11 shows an example of the operation of the heating element monitoring system according to an example of the disclosure. At 1101 the heating element controller 904 may activate the heating element and start a timer for the third predetermined time period. At 1102, at the end of the third predetermined time period, the heating element controller 904 may communicate a notification signal to the heating element diagnostic module 905.

In parallel to the processes performed at the heating element controller 904, at 1103 the activation detector module 906 may detect activation of the heating element and start a timer for the first predetermined time period. That is, a timer for the first predetermined time period may be started by the activation detector module 906 when it is determined that a value of a detected signal indicative of an operation of the heating element exceeds a predetermined activation threshold, as described above. At 1104, at the end of the first predetermined time period, the activation detector module 906 may start a timer for the second predetermined time period. At 1105, at the end of the second predetermined time period, the activation detector module 906 may communicate a signal indicative of an operation of the heating element during the second predetermined time period to the heating element diagnostic module 905.

At 1106, when the notification signal is received from the heating element controller 904, the heating element diagnostic module 905 may start a timer for the fourth predetermined time period. That is, the heating element diagnostic module 905 may determine that activation of the heating element has been attempted by the heating element controller 904 when the notification signal is received from the heating element controller 904. At 1107, at the end of the fourth predetermined time period, the heating element diagnostic module 905 may determine if a signal indicative of an operation of the heating element during the second predetermined time period has been obtained from the activation detector module 906. If the signal has not been obtained, the heating element diagnostic module 905 may output a signal indicating that the heating element is not operating correctly (not shown in FIG. 11). At 1108, if the signal has been obtained, the heating element diagnostic module 905 may compare the obtained signal with a reference signal. At 1109, the heating element diagnostic module 905 may determine, based on the comparison, whether the heating element is operating according to predetermined characteristics.

Figure 12:
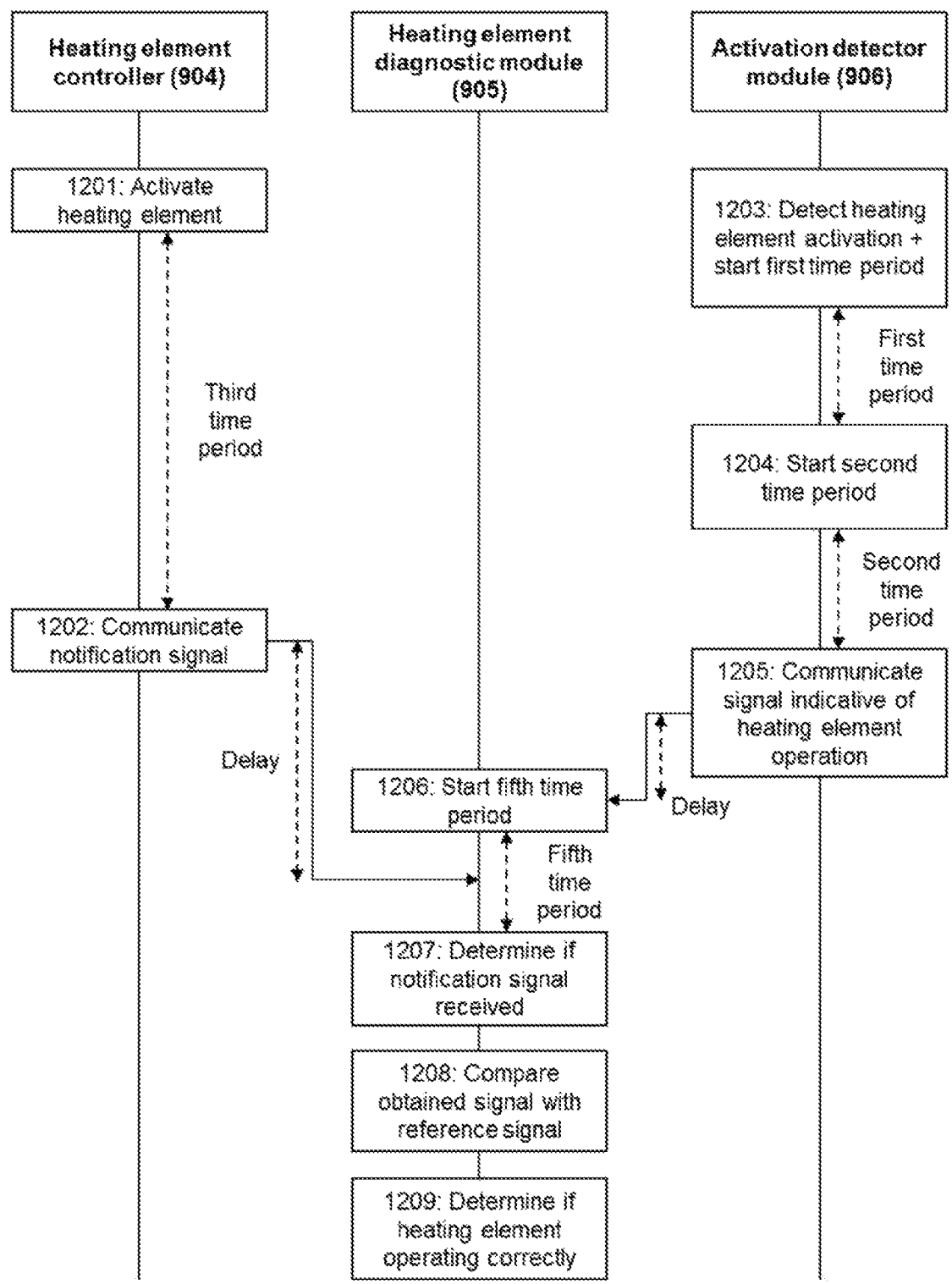
FIG. 12 shows an example of an operation according to an example of the disclosure.
Figure 13:
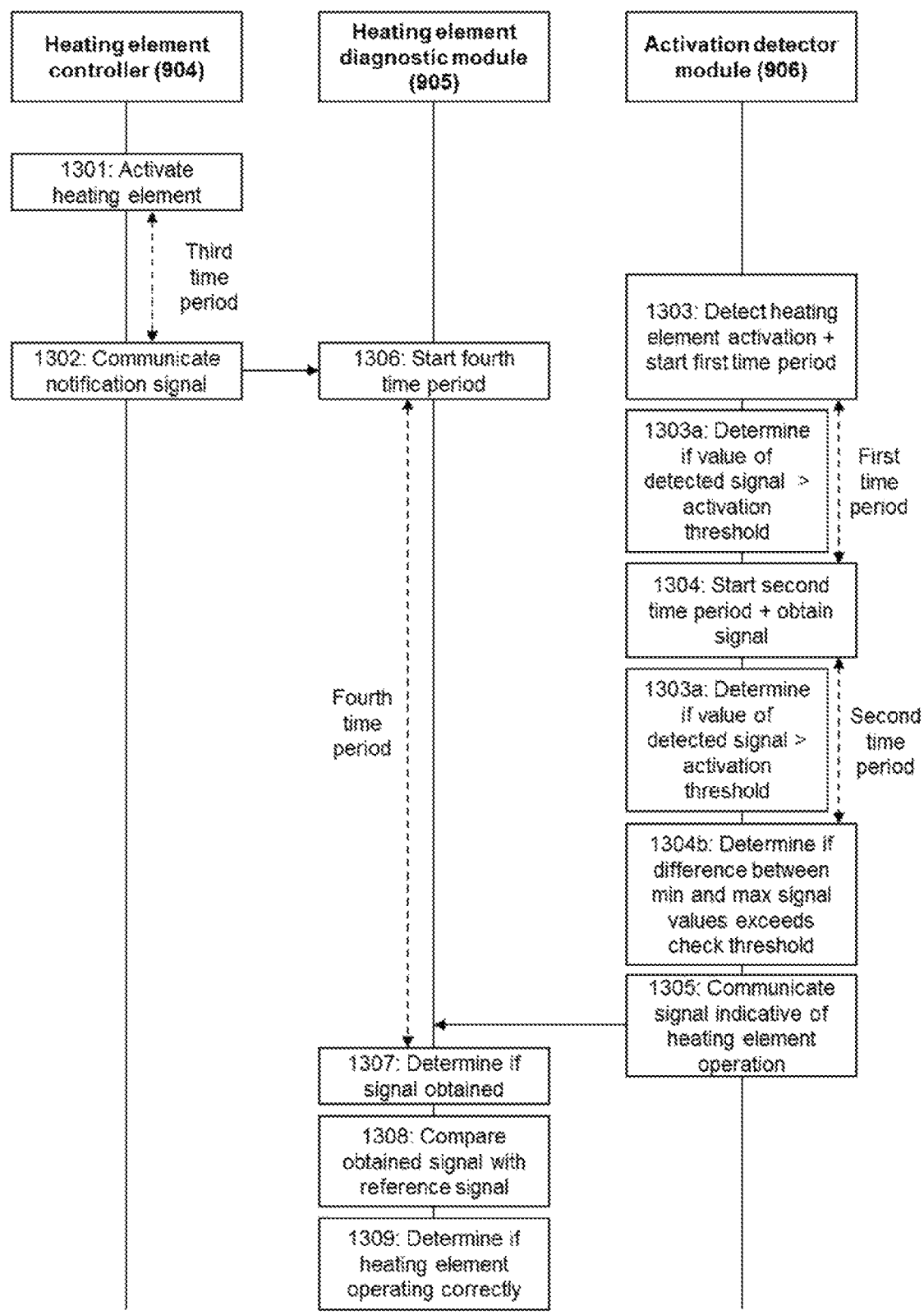
FIG. 13 shows an example of an operation according to an example of the disclosure.

It will be appreciated that the illustrated lengths and relative start and end positions of the predetermined time periods in FIGS. 11-13 are not to scale, and that any suitable lengths and relative start and end positions may be used.

It will be appreciated that the heating element diagnostic module 905 may determine that the signal indicative of an operation of the heating element has been obtained from the activation detector module 906 before the end of the fourth predetermined time period. That is, the heating element diagnostic module 905 may not wait until the end of the fourth predetermined time period to compare the obtained signal with a reference signal if the signal is obtained before the end of the fourth predetermined time period.

FIG. 12 shows an example of an operation according to an example of the disclosure. In some examples, the notification signal may not be received at the heating element diagnostic module 905 until after the signal indicative of an operation of the heating element has been obtained by the heating element diagnostic module 905. This may be caused, for example, by communication delays, or in the case that the activation detector module 906 incorrectly determines that a value of a detected signal indicative of an operation of the heating element exceeds a predetermined activation threshold, or in the case that the activation detector module 906 correctly determines that a value of a detected signal indicative of an operation of the heating element exceeds a predetermined activation threshold, but the heating element controller 904 has not activated the heating element (for example, the activation detector module 906 may have detected a spurious signal). FIG. 12 shows an example of an operation in which the notification signal is not received at the heating element diagnostic module 905 until after the signal indicative of an operation of the heating element has been obtained by the heating element diagnostic module 905. In FIG. 12, this is illustrated as being caused by communication delays. 1201-1205 and 1208-1209 are the same as 1101-1105 and 1108-1109, respectively, in FIG. 11.

At 1206, the heating element diagnostic module 905 may obtain a signal indicative of a heating element operation from the activation detector module 906 and determine that a timer for the fourth predetermined period is not currently running. The heating element diagnostic module 905 may start a timer for a fifth predetermined time period in response to determining that a signal indicative of a heating element operation has been obtained from the activation detector module 906 outside of the fourth predetermined time period.

At 1207, at the end of the fifth predetermined time period, the heating element diagnostic module 905 may determine if a notification signal has been received from the heating element controller 904. If the notification signal has not been received (not shown in FIG. 12), the obtained signal indicative of a heating element operation may be disregarded and the heating element diagnostic module 905 may await reception of a new signal indicative of a heating element operation or a notification signal (not shown in FIG. 12). In some examples, the heating element diagnostic module 905 may output a signal indicating that the heating element monitoring system is not operating correctly (not shown in FIG. 12). At 1208, if the notification signal has been obtained, the heating element diagnostic module 905 may compare the obtained signal with a reference signal.

FIG. 13 shows an example of an operation according to an example of the disclosure. Processes 1301-1309 are the same as 1101-1109 in FIG. 11. It will be appreciated that 1301-1309 could also be the same as 1201-1209 in FIG. 12 if the notification signal is not received at the heating element diagnostic module 905 until after the signal indicative of an operation of the heating element has been obtained by the heating element diagnostic module 905.

During the first predetermined time period, at 1303a, the activation detector module 906 may determine if a value of a detected signal indicative of an operation of the heating element exceeds a predetermined activation threshold. It will be appreciated that 1303a may represent a continuous process occurring for the duration of the first predetermined time period. If the activation detector module 906 determines that a value of the detected signal does not exceed the predetermined activation threshold at any point (not shown in FIG. 13), the timer for the first predetermined time period may be stopped and the activation detector module 906 may await detection of heating element activation at 1303. Otherwise, 1303a may continue until the end of the first predetermined time period.

During the second predetermined time period, at 1304a, the activation detector module 906 may determine if a value of the detected signal exceeds the predetermined activation threshold. It will be appreciated that 1304a may represent a continuous process occurring for the duration of the second predetermined time period. If the activation detector module 906 determines that a value of the detected signal does not exceed the predetermined activation threshold at any point (not shown in FIG. 13), the timer for the second predetermined time period may be stopped and the activation detector module 906 may await detection of heating element activation at 1303. Otherwise, 1304a may continue until the end of the second predetermined time period.

At 1304b, at the end of the second predetermined time period, the activation detector module 906 may determine whether a difference between minimum and maximum values of the detected signal exceeds a predetermined check threshold. If the activation detector module 906 determines that a difference between minimum and maximum values of the detected signal exceeds the predetermined check threshold (not shown in FIG. 13), the activation detector module 906 may await detection of heating element activation at 1303. Otherwise, the activation detector module 906 may communicate a signal indicative of the heating element operation during the second predetermined time period to the heating element diagnostic module 905 at 1305.

FIG. 14 shows an example of an operation of the heating element controller 904 according to an example of the disclosure. In some examples, the operation illustrated in FIG. 14 may replace 1101-1102 in FIG. 11, 1201-1202 in FIG. 12, or 1301-1302 in FIG. 13.

At 1401a the heating element controller 904 may obtain a heating element driving signal. At 1401b, the heating element controller 904 may determine if a value of the heating element driving signal exceeds a predetermined driving threshold. If the value of the heating element driving signal does not exceed the predetermined driving threshold (not shown in FIG. 14), the heating element controller 904 may await a heating element driving signal at 1401a.

At 1401c the heating element controller 904 may start a timer for the third predetermined time period. That is, a timer for the third predetermined time period may be started if a value of the heating element driving signal exceeds a predetermined driving threshold.

During the third predetermined time period, at 1401*d*, the heating element controller 904 may determine if a value of the heating element driving signal exceeds the predetermined driving threshold. It will be appreciated that 1401*d* may represent a continuous process occurring for the duration of the third predetermined time period. If the heating element controller 904 determines that a value of the heating element driving signal does not exceed the predetermined driving threshold at any point (not shown in FIG. 14), the timer for the third predetermined time period may be stopped and the activation detector module 906 may await a heating element driving signal at 1401*a*.

During the third predetermined time period, at 1401*e*, the heating element controller 904 may determine if a value of the heating element driving signal varies by more than a predetermined variation threshold. For example, a present value of the heating element driving signal may be compared with a past value of the heating element driving signal. If the difference between the present and past values exceeds a predetermined variation threshold, it may be determined that the present value of the heating element driving signal varies by more than a predetermined variation threshold. It will be appreciated that 1401*e* may represent a continuous process occurring for the duration of the third predetermined time period. If it is determined that a value of the heating element driving signal varies by more than a predetermined variation threshold (not shown in FIG. 14), the heating element controller 904 may restart the timer for the third predetermined time period at 1401*c*.

At 1402, at the end of the third predetermined time period, the heating element controller 904 may communicate a notification signal to the heating element diagnostic controller as in 1102 in FIG. 11, 1202 in FIG. 12, and 1302 in FIG. 13. It will be appreciated that the timer will reach the end of the third predetermined time period if, for the duration of the third predetermined time period, the heating element controller 904 does not determine that a value of the heating element driving signal decrease below the predetermined driving threshold and if the heating element controller 904 does not determine that a value of the heating element driving signal varies by more than a predetermined variation threshold. The length of the third predetermined time period, and the values of the predetermined driving threshold and predetermined variation threshold may be set to ensure that a notification signal is not sent to the heating element diagnostic module 905 unless the heating element driving signal is suitable for driving a heating element operation suitable for determining if the heating element is operation according to predetermined characteristics.

In some examples, the reference signals or predetermined thresholds to be used subsequently may be calculated by the heating element controller 904 based on the heating element driving signal. For example, the value of the heating element driving signal at the end of the third predetermined time period may be used by the heating element controller 904 to calculate a reference signal for comparison with the obtained signal at 1109, 1209 or 1309 and the calculated reference signal may be communicated by the heating element controller 904 to the heating element diagnostic module 905 with the activation signal at 1102, 1202, or 1302.

Figure 15:
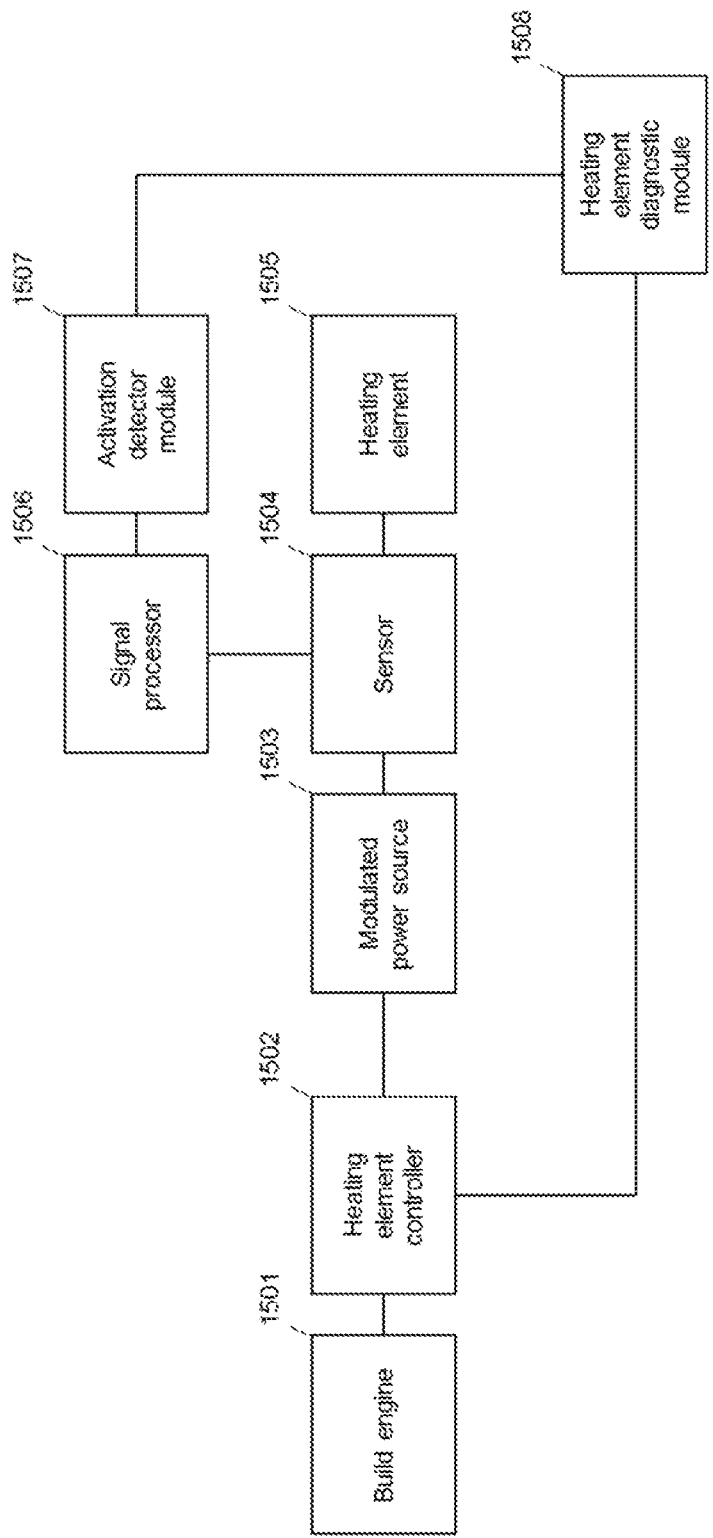
FIG. 15 shows an example of an energy source monitoring system in a 3D printer according to an example of the disclosure.

FIG. 15 shows an example of a heating element monitoring system in a 3D printer according to an example of the disclosure. A build engine 1501 of the 3D printer may communicate a heating element driving signal to a heating element controller 1502, the heating element driving signal comprising instructions for driving a heating element 1505 in a 3D printing operation. The heating element controller 1502 may process the heating element driving signal and communicate a pulse width modulation signal to a modulated power source 1503 which drives the heating element 1505. The heating element controller 1502 may also communicate a notification signal to a heating element diagnostic module 1508 if it determines that the heating element driving signal is suitable for driving a heating element operation that is suitable for determining whether the heating element 1505 is operating according to predetermined characteristics. The notification signal may inform the heating element diagnostic module 1508 to expect a signal indicative of a heating element operation from an activation detector module 1507.

The activation detector module 1507 may receive a signal indicative of a heating element operation from a sensor 1504. The signal from the sensor 1504 may be processed by a signal processor 1506. In some examples, sensor 1504 may be a current sensor that detects a current driving the heating element 1505 and the signal processor 1506 may comprise, for example, an analogue-to-digital converter and a low-pass filter. However, it will be appreciated that the sensor 1504 may be any sensor suitable for detecting an input or output of the heating element 1505 if that input or output is suitable for indicating an operation of the heating element 1505, and that the signal processor 1506 may comprise any components suitable for processing the signal from the sensor 1504. If the activation detector 1507 determines that the signal received from the sensor 1504 via the signal processor 1506 is suitable for determining whether the heating element 1505 is operating according to predetermined characteristics, the activation detector module 1507 may communicate a signal indicative of a heating element operation to the heating element diagnostic module 1508. The heating element diagnostic module 1508 may use the obtained signal to determine whether the heating element 1505 is operating according to predetermined characteristics, and communicate a signal indicating whether the heating element 1505 is operating according to predetermined characteristics to the heating element controller 1502.

Although the above description relates to heating elements in 3D printers, the skilled person will appreciate that the above disclosure may be applicable to any energy source, for instance heating or power delivery elements, particularly where there may be similar periodic activation cycles and the need to monitor the operating characteristics of the energy source during activation.

All of the features disclosed in this specification (including any accompanying claims, abstract, and drawings) may be combined in any combination, except combinations where some of such features are mutually exclusive. Each feature disclosed in this specification, including any accompanying claims, abstract, and drawings), may be replaced by alternative features serving the same, equivalent, or similar purpose, unless expressly stated otherwise. Thus, unless expressly stated otherwise, each feature disclosed is one example of a generic series of equivalent or similar features.

The present teachings are not restricted to the details of any foregoing examples. Any novel combination of the features disclosed in this specification (including any accompanying claims, abstract, and drawings) may be envisaged. The claims should not be construed to cover merely the foregoing examples, but also any variants which fall within the scope of the claims.

The invention claimed is:

1. An energy source monitoring system comprising:

an energy source controller; and an energy source diagnostic module that, via one or more processors:

obtains, from the energy source controller, a signal indicative of an electrical current value for an energy source of a 3D printer during a second predetermined time period commencing with the end of a first predetermined time period, the first predetermined time period commencing with an activation of the energy source, wherein the energy source is active throughout the first and second predetermined time periods;

compares the electrical current value of the obtained signal with a reference signal; and determines, based on the comparison, whether the energy source is operating according to predetermined characteristics; and an activation detector module that:

detects a signal indicative of an energy source operation;

determines whether a difference between minimum and maximum values of the detected signal during the second predetermined time period exceeds a predetermined check threshold; and cancels, when the difference exceeds the predetermined check threshold, the comparison of the obtained signal to the reference signal;

wherein the energy source controller further:

obtains an energy source driving signal;

starts a timer for a third predetermined time period when a value of the energy source driving signal exceeds a predetermined driving threshold;

stops the timer for the third predetermined time period when the value of the energy source driving signal decreases below the predetermined driving threshold;

restarts the timer for the third predetermined time period when the value of the energy source driving signal varies by more than a predetermined variation threshold; and outputs a notification signal at the end of the third predetermined time period;

and wherein the energy source diagnostic module further:

starts a timer for a fourth predetermined time period when the notification signal from the energy source controller is detected; and determines that the energy source is not operating according to the predetermined characteristics when the signal indicative of an operation of the energy source is not obtained by the end of the fourth predetermined time period.

2. The energy source monitoring system of claim 1, wherein the an electrical current value quantifies a current drawn by the energy source.

3. The energy source monitoring system of claim 1, wherein the reference signal comprises a predetermined range, and wherein the energy source diagnostic module determines that the energy source is operating according to predetermined characteristics when maximum and minimum electrical current values of the obtained signal are within the predetermined range.

* * * * *